United States Patent [19]

Noguchi et al.

[11] Patent Number: 5,378,289
[45] Date of Patent: Jan. 3, 1995

[54] METHOD OF FORMING CRYSTALLINE SILICON FILM AND SOLAR CELL OBTAINED THEREBY

[75] Inventors: Shigeru Noguchi, Hirakata; Keiichi Sano, Moriguchi; Hiroshi Iwata, Neyagawa, all of Japan

[73] Assignee: Sanyo Electric Co., Ltd., Osaka, Japan

[21] Appl. No.: 151,271

[22] Filed: Nov. 12, 1993

[30] Foreign Application Priority Data

Nov. 20, 1992 [JP] Japan ................. 4-312151

[51] Int. Cl.6 ............... H01L 31/0236; H01L 31/18; H01L 31/0368
[52] U.S. Cl. .................... 136/258; 136/256; 437/4; 437/233; 437/247; 437/249; 437/967; 264/104
[58] Field of Search ............. 437/4, 233, 247, 249, 437/967; 264/104; 136/258 PC, 256

[56] References Cited

U.S. PATENT DOCUMENTS

| | | | |
|---|---|---|---|
| 4,735,909 | 4/1988 | Albright et al. | 437/4 |
| 5,098,850 | 3/1992 | Nishida et al. | 437/4 |
| 5,213,670 | 5/1993 | Bertagnolli | 204/192.25 |
| 5,221,365 | 6/1993 | Noguchi et al. | 136/258 |
| 5,238,879 | 8/1993 | Plaettner | 437/233 |
| 5,290,712 | 3/1994 | Sato et al. | 437/24 |
| 5,318,661 | 6/1994 | Kumomi | 117/8 |

FOREIGN PATENT DOCUMENTS

| | | | |
|---|---|---|---|
| 59-152672 | 8/1984 | Japan . | |
| 1-286423 | 11/1989 | Japan | 437/249 |
| 2-165620 | 6/1990 | Japan . | |
| 4-127519 | 4/1992 | Japan | 437/247 |

OTHER PUBLICATIONS

Doi, Atsutoshi, *Appl. Phys. Lett.* 59(20), "Solid phase epitaxial seed for laser-crystallized silicon on glass substrates", Nov. 11, 1991, pp. 2518–2520.

"Advantages of Textured Multicrystalline Silicon for MIS Inversion Layer Solar Cells" by R. Hezel and L. Hu; pp. 701–704 of the 1990 Technical Digest of the International PVSEC-5, held at Kyoto, Japan.

*Primary Examiner*—Aaron Weisstuch
*Attorney, Agent, or Firm*—W. G. Fasse; W. F. Fasse

[57] ABSTRACT

A mold of crystalline silicon having a textured surface is placed on an amorphous silicon film so that projecting portions of the textured surface are in contact with a surface of the silicon film. The amorphous silicon film is then heated for crystallizing the same by solid phase epitaxy, thereby forming a crystalline silicon film having a textured surface corresponding to that of the mold.

12 Claims, 6 Drawing Sheets

METHOD OF FORMING CRYSTALLINE SILICON FILM AND SOLAR CELL OBTAINED THEREBY

BACKGROUND OF THE INVENTION

1. Field of the Invention

The present invention relates to a method of forming a crystalline silicon film, and more particularly, it relates to a method of forming a crystalline silicon film which can provide its surface with a desired textured shape.

2. Description of the Background Art

In order to provide a surface of a silicon film with a textured shape, the generally employed methods involve roughening the surface by chemical or physical etching with an inert gas such as helium or argon, a fluorocarbon such as $CF_4$, or a reactive gas such as gaseous hydrogen, or wet etching with KOH or nitric-hydrofluoric acid. In a textured surface obtained by such methods, however, intervals and heights of projecting portions are dispersed to result in a heterogeneously textured shape. In the aforementioned methods, further, the etchant is disadvantageously left on the etched textured surface.

A method of etching a (100) plane of a single-crystalline silicon film with a chemical agent such as sodium hydroxide or potassium hydroxide is known as a method of forming a relatively homogeneously textured surface (R. Hezel and L. Hu, Tech. Digest of the Int'l PVSEC-5 (1990), p. 701). According to this method, it is possible to obtain a relatively homogeneously textured shape as compared with a textured surface obtained by the aforementioned etching methods. However, this method is only applicable to a surface of a single-crystalline silicon film having a (100) plane. Further, it is impossible to form a desired textured shape since intervals and heights of projecting portions forming the textured shape depend on the lattice constant.

SUMMARY OF THE INVENTION

An object of the present invention is to provide a method that can form a silicon film having excellent crystallinity with a desired textured shape such as a homogeneous textured shape provided on its surface.

The inventive method of forming a crystalline silicon film is adapted to provide a surface of such a crystalline silicon film with a textured shade by crystallizing an amorphous silicon film through solid phase epitaxy.

The method according to the present invention comprises a step of preparing a mold of crystalline silicon having a textured surface, a step of placing the textured surface of this mold on an amorphous silicon film for bringing projecting portions of the textured surface of the mold into contact with a surface of the amorphous silicon film under pressure, and a step of heating the amorphous silicon film in such a contact state for crystallizing tile same by solid phase epitaxy, thereby forming a crystalline silicon film having a textured surface corresponding to that of the mold.

According to the present invention, the mold which is placed on the amorphous silicon film is made of crystalline silicon, and has a textured surface. When this textured surface has a homogeneously textured shape, it is possible to form the surface of the crystalline silicon film according to the present invention into a homogeneously textured shape. The textured shape of the mold of crystalline silicon can be formed by a physical or chemical method. For example, the textured shape can be formed by a mechanical method such as cutting, or by etching such as plasma etching or wet etching. The crystalline silicon forming the mold can be selected from single-crystalline silicon, polycrystalline silicon, and microcrystalline silicon.

The textured shape can be provided in the form of grooves, or pyramidal or conical projecting or depressed portions distributed over the surface. Alternatively, the textured shape may be formed by a curved or spherical surface.

According to the present invention, it is possible to form a crystalline silicon film having a homogeneously textured surface by providing the mold with a homogeneously textured surface. However, the textured surface is not restricted to a homogeneous one but can be provided in a desired shape. For example, the textured shape can such that the density of projecting or depressed portions is low in a central portion and high in a peripheral portion, or vice versa.

When the formed textured surface has a homogeneously textured shape according to the present invention, the intervals between projecting or depressed portions forming the textured surface are preferably within a range of 0.3 to 100 $\mu$m. Further, the heights of the projecting portions or depths of the depressed portions are preferably within a range of 0.1 to 3 $\mu$m.

According to the present invention, the projecting portions forming the textured surface of the aforementioned mold are brought into contact with the surface of the amorphous silicon film under pressure. The pressure employed at this time is not particularly restricted but must be at a proper level so that the projecting portions forming the textured surface of the mold are embedded in the amorphous silicon film to bring the surface of the obtained crystalline silicon film, which is formed by crystallization of the amorphous silicon film, into a textured shape corresponding to that of tile mold. When the mold is pressurized by a weight or the like, the pressing force is preferably set within a range of 30 to 500 $g/cm^2$, and more preferably, within a range of 300 to 500 $g/cm^2$.

In the present invention, the amorphous silicon film is heated and crystallized by solid phase epitaxy in such a state that its surface is in contact with the projecting portions of the textured surface of the mold. The heating temperature is not particularly restricted as long as the amorphous silicon film can be crystallized by solid phase epitaxy, but is preferably set at a relatively low level in order to start crystallization from portions that are in contact with the projecting portions of the textured surface of the mold as hereinafter described. The heating temperature is preferably within a range of 500° to 600° C., and more preferably within a range of 500° to 550° C.

According to the present invention, the projecting portions of the textured surface of the mold are brought into contact with the surface of the amorphous silicon film, which is crystallized by solid phase epitaxy, under pressure. The amorphous silicon film contracts in volume upon crystallization; but a textured surface corresponding to that of the mold is formed on the silicon film despite such volume contraction upon crystallization, because the textured surface of the mold is placed on the surface of the amorphous silicon film under pressure. According to the present invention, therefore, it is possible to form a desired textured shape on the crystalline silicon film by employing a mold having a desired textured surface.

Further, according to the present invention, crystallization is initiated in such a state that the projecting portions forming the textured surface of the mold are brought into contact with the surface of the amorphous silicon film. It is known that crystallization in solid phase epitaxy initiates from a portion that is in contact with a seed crystal. According to the present invention, therefore, crystallization is started or initiated from surface portions of the amorphous silicon film that are in contact with the projecting portions of the textured surface of the mold. The projecting portions of the mold are provided at prescribed intervals, whereby crystallization is initiated from specific portions of the surface of the amorphous silicon film. According to the present invention, therefore, it is possible to start crystallization only from such specific portions of the surface of the amorphous silicon film, thereby increasing crystal grain sizes. Thus, it is possible to obtain a silicon film having excellent crystallinity with grain sizes that are larger than those of a conventional crystalline silicon film obtained by solid phase epitaxy.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS AND OF THE BEST MODE OF THE INVENTION

Figure 1:
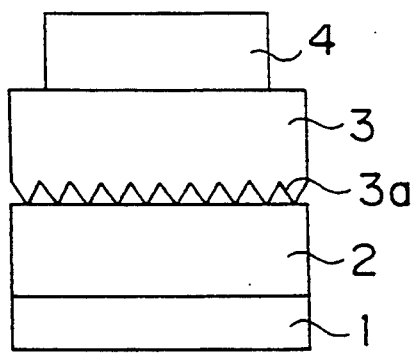
FIG. 1 is a sectional view showing an amorphous silicon film contacting a textured surface of a mold on its surface in an embodiment of the present invention.

FIG. 1 is a sectional view illustrating an embodiment of the present invention. Referring to FIG. 1, an amorphous silicon film 2 is formed on a substrate 1, while a mold 3 of single-crystalline silicon having a textured surface 3a is placed or arranged on the amorphous silicon film 2 so as to downwardly direct the textured surface 3a. A weight 4 is provided on the mold 3. Due to this weight 4 and the weight of the mold 3 itself, forward ends of projecting portions of the textured surface 3a of the mold 3 are pressed against and contact the surface of the amorphous silicon film 2. The weight 4 is so prepared as to provide a pressing force of about 30 g/cm$^2$ including the weight of the mold 3 itself. The textured surface 3a of the mold 3 is formed by pyramidal portions projecting at prescribed intervals. The intervals between such projecting portions of the textured surface 3a are 10 μm, and the heights thereof are 0.5 μm.

In such a state, the amorphous silicon film 2 is heated to a temperature of 550° C., to initiate solid phase epitaxy. Crystallization progresses upon initiation of solid phase epitaxy, whereby the amorphous silicon film 2 is gradually contracted in volume. With such volume contraction, the mold 3 gradually moves downwardly to form the surface of the amorphous silicon film 2 while it is being crystallized, into a textured shape along its textured surface 3a.

Figure 2:
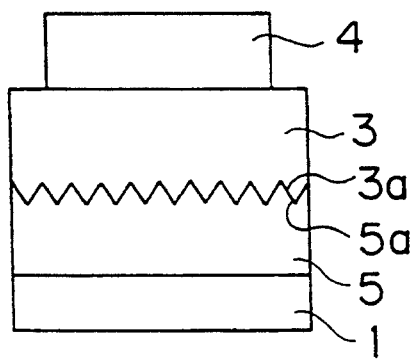
FIG. 2 is a sectional view showing a step of crystallizing the amorphous silicon film by solid phase epitaxy in the state shown in FIG. 1.

FIG. 2 is a sectional view showing a crystalline silicon film 5 resulting from the crystallized amorphous silicon film 2. As shown in FIG. 2, a textured surface 5a is formed on the crystalline silicon film 5 along the textured surface 3a of the mold 3.

Figure 3:
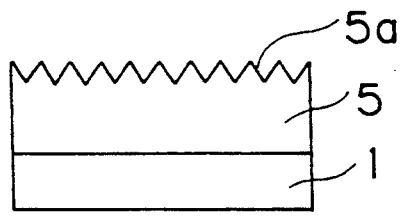
FIG. 3 is a sectional view showing a crystalline silicon film formed by crystallizing the amorphous film through solid phase epitaxy in the embodiment of the present invention.

FIG. 3 shows the crystalline silicon film 5, which is obtained by the aforementioned crystallization through solid phase epitaxy, provided on the substrate 1. As shown in FIG 3, it is possible to form the textured surface 5a on the crystalline silicon film 5 corresponding to the textured surface 3a of the mold 3.

Figure 4:
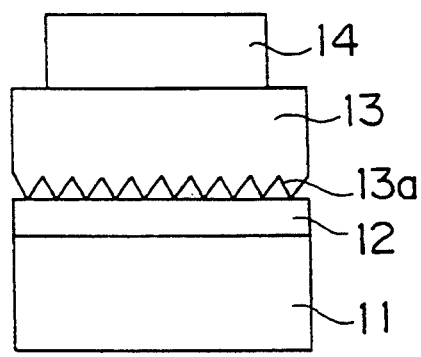
FIG. 4 is a sectional view illustrating another embodiment for applying a crystalline silicon film that is formed according to the inventive method to a photovoltaic device.

FIG. 4 is a sectional view illustrating another embodiment for Forming a crystalline silicon film according to the inventive method which is useful for preparing a solar cell. Referring to FIG. 4, a p-type amorphous silicon film 12 of 0.2 μm thickness is formed on an n-type single-crystalline silicon substrate 11 of 300 μm thickness. A mold 13 is placed on the p-type amorphous silicon film 12 so as to downwardly direct its textured surface 13a. A weight 14 is placed on this mold 13. The mold 13 and the weight 14 are so prepared as to provide a pressing force of about 50 g/cm$^2$ in total. The textured surface 13a of the mold 13 is formed by pyramidal projecting portions, which are at intervals of 0.3 μm with heights of 0.1 μm.

The p-type amorphous silicon film 12 is heated to a temperature of 600° C., and crystallized by solid phase epitaxy.

Figure 5:
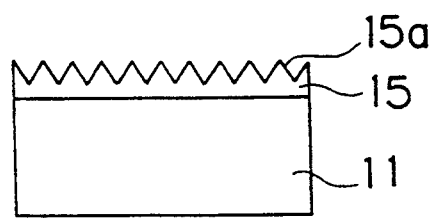
FIG. 5 is a sectional view showing a p-type crystalline silicon film formed in the embodiment shown in FIG. 4.

FIG. 5 is a sectional view showing a p-type polysilicon film 15 obtained in the aforementioned manner. As shown in FIG. 5, the p-type polysilicon film 15 is formed on the n-type single-crystalline silicon substrate 11. The textured surface 15a formed on this p-type polysilicon film 15 has a textured shape corresponding to that of the textured surface 13a of the mold 13 shown in FIG. 4.

Figure 6:
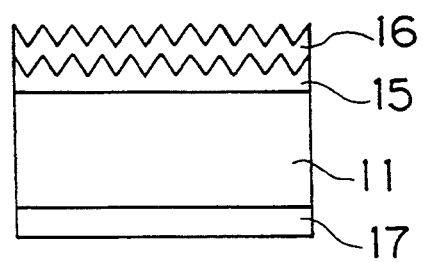
FIG. 6 is a sectional view showing a photovoltaic device which is formed by mounting electrodes on the laminate of silicon shown in FIG. 5.

FIG. 6 is a sectional view showing a photovoltaic device prepared from the p-type polysilicon film 15 shown in FIG. 5. Referring to FIG. 6, a front electrode 16, which is formed by a transparent conductor film of indium tin oxide, is provided on the p-type polysilicon film 15. Opposite the front electrode 16 a back electrode 17 of a metal is formed on the back surface of the n-type single-crystalline silicon substrate 11 by vapor deposition or the like.

In such a photovoltaic device, the p-type polysilicon film 15 is about 0.15 μm in average thickness, the front electrode 16 is about 700 Å in average thickness, and the back electrode 17 is about 2 μm in average thickness.

Figure 7:
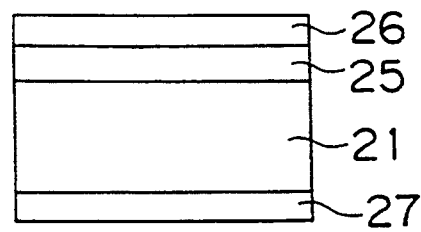
FIG. 7 is a sectional view showing a photovoltaic device prepared as a comparative sample.
Figure 8:
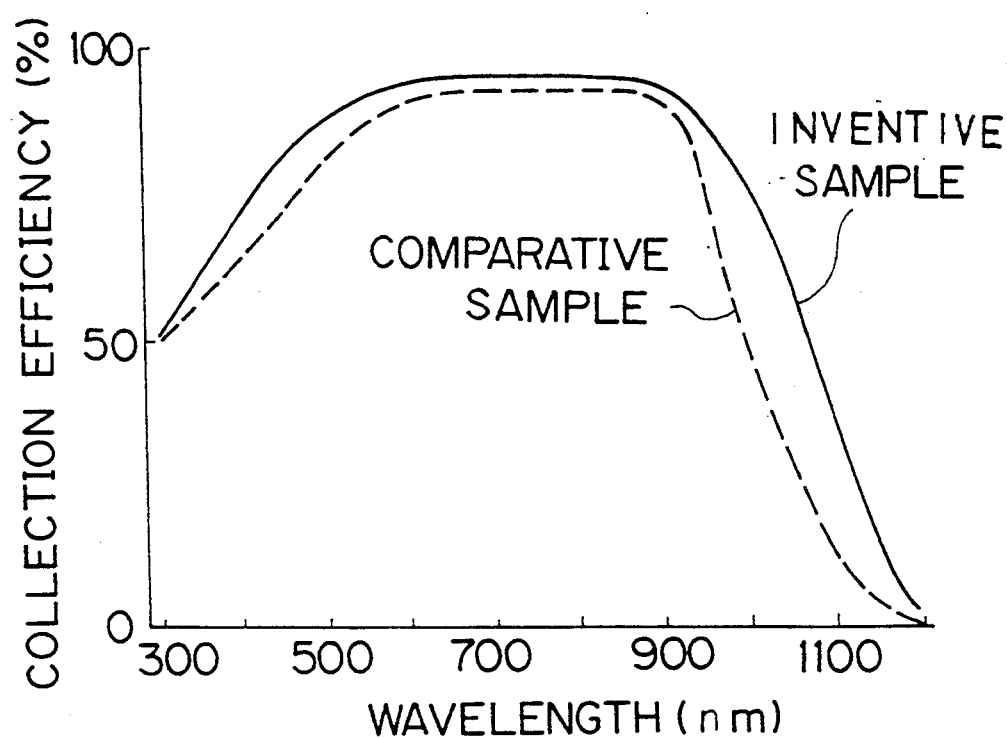
FIG. 8 illustrates collection efficiency values of a sample of the photovoltaic device according to the embodiment shown in FIG. 6 and the comparative sample shown in FIG. 7.

FIG. 7 shows a photovoltaic device, which was prepared as a comparative sample, comprising an n-type single-crystalline silicon substrate 21, a p-type polysilicon film 25 having a flat surface formed on the substrate 21, a front electrode 26 provided on the p-type polysilicon film 25, and a back electrode 27 provided on the back surface of the substrate 21. FIG. 8 shows measured collection efficiency values of a sample of the photovoltaic device shown in FIG. 6 and the comparative sample shown in FIG. 7, respectively.

It is clearly understood from FIG. 8 that the sample of the photovoltaic device according to the embodiment of the present invention was improved in collection efficiency at the shorter and longer wavelengths as compared with the comparative sample.

Figure 9:
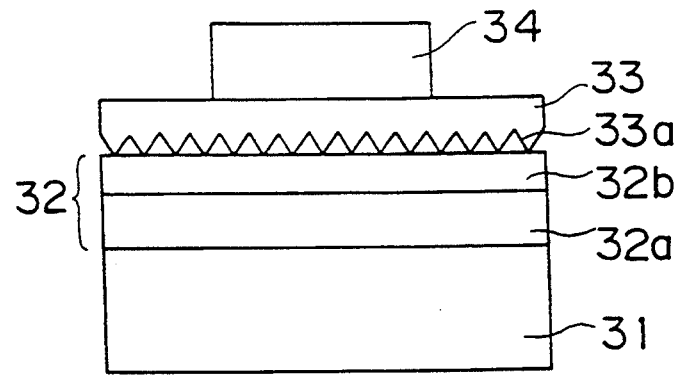
FIG. 9 is a sectional view illustrating still another embodiment for preparing a photovoltaic device using a crystalline silicon film that is formed according to the inventive method.

FIG. 9 is a sectional view illustrating an embodiment of the present invention for crystallizing an amorphous silicon film which is formed on a polysilicon substrate. Referring to FIG. 9, an amorphous silicon film 32 of 3000 Å thickness is provided on an n-type polysilicon substrate 31 of 400 μm in thickness. The amorphous silicon film 32 has a double-layer structure formed by a non-doped amorphous silicon layer 32a of 1000 Å thickness and a B-doped crystalline silicon layer 32b of 2000 Å thickness. Thus, crystal growth is started from the B-doped amorphous silicon layer 32b by solid phase epitaxy, and is prevented from being influenced by the n-type polysilicon substrate 31.

A mold 33 having a textured surface 33a is placed on the B-doped amorphous silicon layer 32b, and a weight 34 is placed on the mold 33. The shape of the textured surface 33a provided on the mold 33 and the total weight of the mold 33 and the weight 34 are similar to those of the embodiment shown in FIG. 4.

Figure 10:
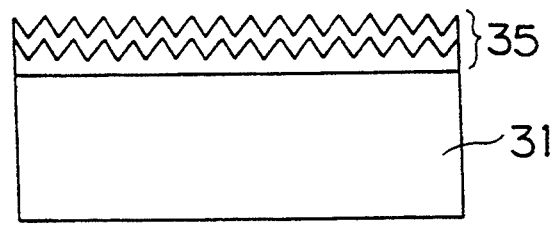
FIG. 10 is a sectional view showing a crystallized state of an amorphous silicon film in the embodiment shown in FIG. 9.
Figure 11:
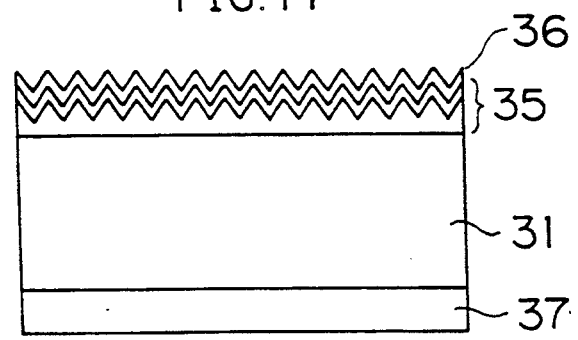
FIG. 11 is a sectional view showing a photovoltaic device that is formed by mounting electrodes on the laminate of silicon shown in FIG. 10;·

FIG. 10 shows a p-type crystalline silicon film 35 obtained by crystallizing by solid phase epitaxy the amorphous silicon film 32 in the state shown in FIG. 9. As shown in FIG. 11, a front electrode 36 of 700 Å thickness is provided on the p-type crystalline silicon film 35 and a back electrode 37 of 2 μm thickness is provided on the back surface of the n-type polysilicon substrate 31, thereby preparing a photovoltaic device.

Figure 12:
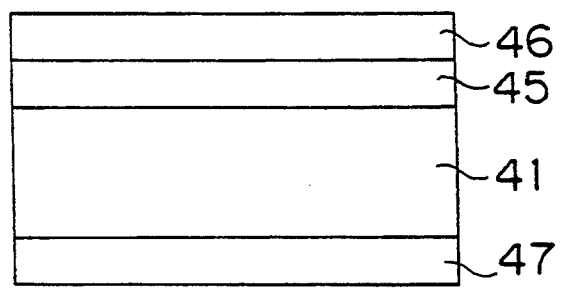
FIG. 12 is a sectional view showing a photovoltaic device prepared as another comparative sample.

FIG. 12 shows a photovoltaic device that was prepared as another comparative sample by crystallizing an amorphous silicon film similar to that shown in FIG. 9 without providing the mold 33 and the weight 34 thereon. Referring to FIG. 12, a p-type crystalline silicon film 45 having a flat surface is provided on an n-type polysilicon substrate 41, and a front electrode 46 is provided on the p-type crystalline silicon film 45. Further, a back electrode 47 is provided on the back surface of the n-type polysilicon substrate 41.

Figure 13:
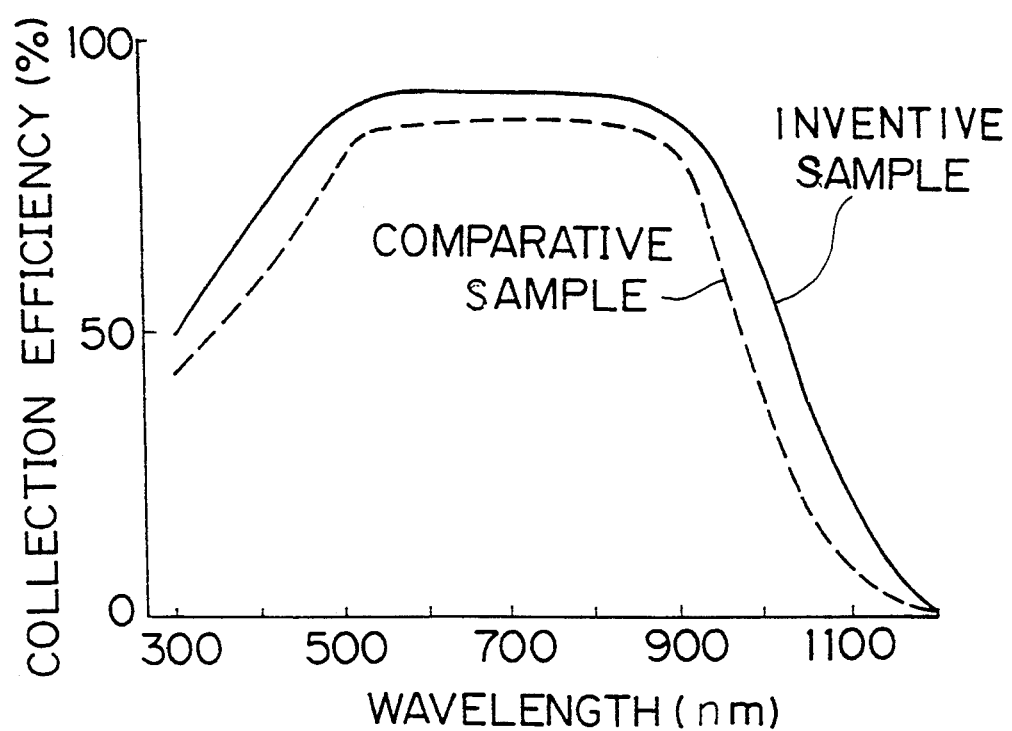
FIG. 13 illustrates collection efficiency values of a sample of the photovoltaic device according to the embodiment shown in FIG. 11 and the comparative sample shown in FIG. 12.

FIG. 13 shows measured collection efficiency values of a sample of the photovoltaic device shown in FIG. 11 and the comparative sample shown in FIG. 12, respectively. As clearly understood from FIG. 13, collection efficiency of the sample of the photovoltaic device provided with a p-type crystalline silicon film having a textured surface according to the present invention was improved at the shorter and longer wavelengths.

Further, it has been confirmed that the crystalline silicon film formed by crystallization through solid phase epitaxy according to the present invention had a crystal grain size two to five times larger as compared with the comparative crystalline silicon film formed by the conventional method.

According to the inventive method of forming a silicon film, it is possible to form a crystalline silicon film having a textured surface corresponding to that of a mold, by employing a mold of crystalline silicon having a textured surface of a desired shape. Therefore, it is possible to provide a surface of a crystalline silicon film with a homogeneously textured shape by employing a mold which is provided with a textured surface having projecting portions with homogeneous intervals and heights.

Further, it is possible to selectively start crystallization from surface portions of an amorphous silicon film that are in contact with projecting portions forming a textured surface of a mold, thereby forming a silicon film having larger crystal grain sizes than a conventional silicon film. Thus, it is possible to form a silicon film which is superior in crystallinity to the conventional silicon film.

Further, it is possible to obtain a photovoltaic device having higher collection efficiency than a conventional device by providing a photoelectric conversion layer with a crystalline silicon film which is formed according to the inventive method, thereby improving photoelectric conversion efficiency.

Figure 14:
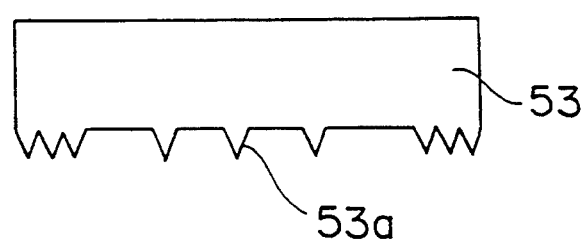
FIG. 14 is a sectional view showing a mold employed in still another embodiment of the present invention.

Further, the mold employed in the present invention is not restricted to the abovementioned mold having a homogeneously textured surface. In the present invention, a mold having any desired shape on its surface may be employed. FIG. 14 is a sectional view showing a mold of still another embodiment of the present invention. Referring to FIG. 14, a textured surface 53a of the mold 53 has a shape such that the density of the projecting and depressed portions is low in a central portion and high in a peripheral portion.

Figure 15:
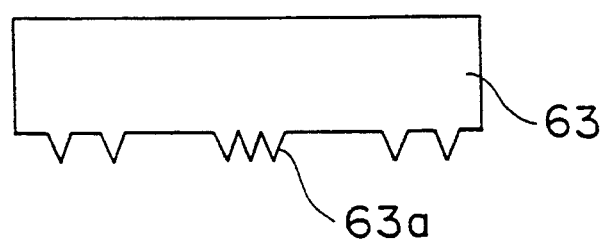
FIG. 15 is a sectional view showing a mold employed in still another embodiment of the present invention.

FIG. 15 is a sectional view showing a mold of still another embodiment of the present invention. Referring to FIG. 15, a textured surface 63a of the mold 63 has a shape such that the density of the projecting and depressed portions is high in a central portion and low in a peripheral portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a crystalline silicon film by crystallizing an amorphous silicon film through solid phase epitaxy, said method comprising the steps of:

preparing a mold of crystalline silicon having a textured surface;

placing said textured surface: of said mold on said amorphous silicon film fop bringing projecting portions of said textured surface of said mold into contact under pressure with a surface of said amorphous silicon film; and heating said amorphous silicon film, having said surface in contact with said projecting portions of said textured surface of said mold, for crystallizing the same by solid phase epitaxy, thereby forming a crystalline silicon film having a textured surface corresponding to said textured surface of said mold.

2. The method of forming a crystalline silicon film in accordance with claim 1, wherein said crystalline silicon forming said mold is single-crystalline silicon.

3. The method of forming a crystalline silicon film in accordance with claim 1, wherein said textured surface of said mold is continuously provided with a texture.

4. The method of forming a crystalline silicon film in accordance with claim 1, wherein the intervals between said projecting portions of said textured surface of said mold are within a range of 0.3 to 100 $\mu$m.

5. The method of forming a crystalline silicon film in accordance with claim 1, wherein the heights of said projecting portions of said textured surface of said mold are within a range of 0.1 to 3 $\mu$m.

6. The method of forming a crystalline silicon film in accordance with claim 1, wherein at least a surface layer of said amorphous silicon film in contact with said projecting portions of said mold is doped with a dopant.

7. The method of forming a crystalline silicon film in accordance with claim 1, wherein said heating comprises a step of heating to a temperature of 500° to 600° C.

8. The method of forming a crystalline silicon film in accordance with claim 1, wherein said heating step comprises a step of heating to a temperature of 500° to 550° C.

9. The method of forming a crystalline silicon film in accordance with claim 1, wherein said crystallization of said amorphous silicon is accompanied by a volume contraction.

10. The method of forming a crystalline silicon film in accordance with claim 1, wherein said textured surface of said mold is formed in such a shape that the density of said projecting portions is low in a central portion and high in a peripheral portion.

11. The method of forming a crystalline silicon film in accordance with claim 1, wherein said textured surface of said mold is formed in such a shape that the density of said projecting portions is high in a central portion and low in a peripheral portion.

12. A photovoltaic device having a photoelectric conversion layer provided with a crystalline silicon film formed by a method in accordance with claim 1.

* * * * *

UNITED STATES PATENT AND TRADEMARK OFFICE
CERTIFICATE OF CORRECTION

PATENT NO. : 5,378,289
DATED : January 3, 1995
INVENTOR(S) : Noguchi et al.

It is certified that error appears in the above-identified patent and that said Letters Patent is hereby corrected as shown below:

```
Column 1, line 57, replace "tile" by --the--.
Column 2, line 17, after "can" insert --be--;
          line 38, replace "tile" by --the--.

Column 4, line 6, after "invention;" insert --and--;
          line 53, replace "Forming" by --forming--.

Column 5, line 14, after "16" insert --,--.

Column 7, Claim 1, claim line 6, delete ":";
                   claim line 7, replace "fop" by --for--.
```

Signed and Sealed this

Eighth Day of August, 1995

Attest:

BRUCE LEHMAN

*Attesting Officer*    *Commissioner of Patents and Trademarks*